United States Patent [19]
Miura

[11] Patent Number: 5,908,150
[45] Date of Patent: Jun. 1, 1999

[54] METHOD FOR INNER LEAD BONDING

[75] Inventor: Takeo Miura, Kumamoto, Japan

[73] Assignee: NEC Corporation, Japan

[21] Appl. No.: 08/865,397

[22] Filed: May 29, 1997

[30] Foreign Application Priority Data

May 30, 1996 [JP] Japan .................................. 8-136675

[51] Int. Cl.$^6$ ................................................ H01L 21/60
[52] U.S. Cl. ...................... 228/102; 228/105; 228/180.5; 382/146
[58] Field of Search .................................. 228/102, 105, 228/180.5, 110.1, 4.5, 9; 382/146, 147

[56] References Cited

U.S. PATENT DOCUMENTS

| | | | |
|---|---|---|---|
| 5,113,565 | 5/1992 | Cipolla et al. ......................... | 29/25.01 |
| 5,125,036 | 6/1992 | Raghavan et al. ....................... | 382/146 |
| 5,238,174 | 8/1993 | Ricketson et al. ................. | 228/180.21 |
| 5,474,224 | 12/1995 | Nishimaki et al. ..................... | 228/102 |
| 5,566,876 | 10/1996 | Nishimaki et al. ..................... | 228/102 |
| 5,579,984 | 12/1996 | Sasano ................................. | 228/102 |
| 5,781,656 | 6/1998 | Hagino et al. .......................... | 382/147 |

*Primary Examiner*—Samuel M. Heinrich
*Assistant Examiner*—Kiley Stoner

*Attorney, Agent, or Firm*—Hayes, Soloway, Hennessey, Grossman & Hage, P.C.

[57] ABSTRACT

There is provided a method of bonding inner leads of lead frames to electrodes of semiconductor chips, including the steps of (a) pictorially recognizing bonding sites of inner leads a semiconductor chip through wires for the certain number of lead frames among a plurality of lead frames and analyzing the bonding sites to obtain coordinate data numerically expressing the bonding sites, (b) calculating statistic about dispersion in the thus obtained coordinate data, (c) judging whether the thus calculated statistic is smaller or greater than a predetermined threshold value, and (d) bonding inner leads of lead frames to electrodes of semiconductor chips for the rest of lead frames in accordance with predetermined bonding site data without pictorially recognizing bonding sites thereof, if the statistic is equal to or smaller than the predetermined threshold value, or bonding inner leads of lead frames to electrodes of semiconductor chips for the rest of lead frames by pictorially recognizing bonding sites in advance for the rest of lead frames, if the statistic is greater than the predetermined threshold value. In accordance with the above mentioned method, it is possible to omit pictorial recognition for the rest of lead frames, if statistic calculated based on dispersion in bonding sites in the certain number of lead frames is smaller than a threshold value, resulting in significant improvement in bonding speed.

15 Claims, 6 Drawing Sheets

METHOD FOR INNER LEAD BONDING

BACKGROUND OF THE INVENTION

1. Field of the Invention

The invention relates to a method and an apparatus for bonding inner leads of lead frames to electrodes of semiconductor chips through wires, and more particularly to pictorial recognition of bonding sites at which inner leads are bonded to electrodes of semiconductor chips.

2. Description of the Related Art

In a conventional method of recognizing inner leads, there has been employed a charge coupled device (CCD) camera for recognizing bonding sites located in the vicinity of distal ends of inner leads of a lead frame, and then there has been calculated coordinate values for the bonding sites in a certain coordinate system. Then, a wire-bonding head wire-bonds inner leads to electrodes of a semiconductor chip mounted on a lead frame through wires in a subsequent stage in accordance with the thus calculated coordinate values.

FIG. 1 is a flow chart showing respective steps of a conventional method. In step 1, inner leads of lead frames successively fed are recognized by a CCD camera in binary or multivalued condition. Then, in step 2, coordinate values in X and Y axes are calculated for bonding sites in a certain coordinate system. Thus, there are obtained coordinate values of bonding sites necessary for wire-bonding a plurality of inner leads to a single semiconductor chip.

Then, in step 3, wire-bonding is carried out in accordance with the coordinate values of bonding sites calculated in step 2. Steps 1 to 3 are repeated until all of inner leads are wire-bonded to electrodes of semiconductor chips, as indicated in step 4.

As is obvious in view of the flow chart in FIG. 1, all of inner leads have been recognized by a CCD camera to calculate coordinate values of all of bonding sites, and then wire-bonding has been carried out in the above mentioned conventional method.

A lead frame having the small number of inner leads often has relatively wide inner leads, and hence dispersion in a position of inner leads can be absorbed in such a wide width of inner leads. Hence, wire-bonding can be carried out in accordance with bonding site data in advance stored in a memory, even if bonding sites in inner leads are not recognized by, for instance, a CCD camera. However, a lead frame having the greater number of inner leads is often made to have small width inner leads or to have complicated shape. Such small width inner leads and complicated shape causes deformation of inner leads when a lead frame is formed, and/or lowers accuracy with which a lead frame is formed. Thus, it was necessary in a conventional method to recognize all of bonding sites in inner leads prior to wire-bonding.

It takes about 2 to 5 seconds per a semiconductor chip for recognition of all of bonding sites. Hence, if four semiconductor chips are to be mounted on a lead frame, it would take 8 to 20 seconds for accomplishing recognition of all of bonding sites in such a lead frame. Thus, if recognition of all of bonding sites in a lead frame is to be carried out, it is not possible to shorten fabrication time, resulting in that the recognition is a bar for improving productivity.

SUMMARY OF THE INVENTION

In view of the above mentioned problem in a conventional wire-bonding method, it is an object of the present invention to provide a method of wire-bonding inner leads of lead frames to electrodes of semiconductor chips, which method is capable of shortening time for judging whether all of bonding sites are correctly in designed location.

In one aspect, there is provided a method of wire-bonding inner leads of lead frames to electrodes of semiconductor chips, including the steps of (a) pictorially recognizing bonding sites at which inner leads of a lead frame are to be bonded to electrodes of a semiconductor chip for the certain number of lead frames among a plurality of lead frames, the certain number of lead frames including a lead frame located at the head of the plurality of lead frames, and analyzing the bonding sites to obtain coordinate data numerically expressing the bonding sites, (b) calculating statistic about dispersion in the thus obtained coordinate data, (c) judging whether the thus calculated statistic is smaller or greater than a predetermined threshold value, and (d) bonding inner leads of lead frames to electrodes of semiconductor chips for the rest of lead frames in accordance with predetermined bonding site data without pictorially recognizing bonding sites thereof, if the statistic calculated in the step (c) is equal to or smaller than the predetermined threshold value, or bonding inner leads of lead frames to electrodes of semiconductor chips for the rest of lead frames by pictorially recognizing bonding sites in advance for the rest of lead frames, if the statistic calculated in the step (c) is greater than the predetermined threshold value.

There may be employed coordinate data obtained by analyzing bonding sites of the certain number of lead frames in the step (d) in place of the predetermined bonding site data.

If the statistic is greater than the predetermined threshold value for a bonding site in a certain inner lead, corresponding bonding sites may be analyzed for inner leads of the rest of lead frames. Each of the lead frames may be formed with a plurality of locations in which a plurality of inner leads are arranged, in which case, bonding sites are analyzed in the step (a) for each of the locations and/or for each of corresponding inner leads in the plurality of lead frames.

The predetermined threshold value may be selected to be a difference between maximum and minimum values in the dispersion in the coordinate data, or a standard deviation for the dispersion in the coordinate data. In particular, it is preferable that the predetermined threshold value is selected to be 50 $\mu$m.

For instance, the certain number of lead frames may be selected to be equal to the number of one lot of lead frames.

The statistic may be calculated in the step (b) about how the bonding sites are deviated in two axes perpendicular to each other from correct sites at which the bonding sites should be located. If a bonding site in a lead frame among the certain number of lead frames is found by pictorial recognition in the step (a) to be deviated from a correct site thereof in an axis by a certain value which is within an allowable range, corresponding bonding sites in the rest of lead frames may be dealt with as they are deviated from correct sites thereof by the certain value. Similarly, if a bonding site in a certain location of a lead frame among the certain number of lead frames is found by pictorial recognition in the step (a) to be greater than the predetermined threshold value in an axis, all the bonding sites in a corresponding location of all the lead frames are pictorially recognized in the axis.

Bonding sites only in a certain location of the certain number of lead frames may be pictorially recognized, in which case bonding sites in the rest of locations are not pictorially recognized.

In another aspect, there is provided an apparatus for wire-bonding inner leads of lead frames to electrodes of semiconductor chips, including (a) a lead frame feeder for successively feeding lead frames, (b) a pictorially recognizing unit for pictorially recognizing bonding sites at which inner leads of a lead frame are to be bonded to electrodes of a semiconductor chip for the certain number of lead frames fed by the lead frame feeder, (c) a wire-bonding head for bonding the inner leads to the electrodes at the bonding sites through wires, the wire-bonding head being controlled in its operation by a later mentioned controller, and (d) a controller receiving information about bonding sites from the pictorially recognizing unit and analyzing the information to obtain coordinate data numerically expressing the bonding sites, and transmitting operation signals to the wire-bonding head. Herein, the controller (a) calculates statistic about dispersion in the coordinate data, (b) judges whether the thus calculated statistic is smaller or greater than a predetermined threshold value, and (c) transmits instruction signals to the pictorially recognizing unit so as not to pictorially recognize bonding sites for the rest of lead frames, if the calculated statistic is equal to or smaller than the predetermined threshold value, or transmits instruction signals to the pictorially recognizing unit so as to pictorially recognize bonding sites for the rest of lead frames, if the calculated statistic is greater than the predetermined threshold value, and further transmitting an operation signal to the wire-bonding head so as to bond inner leads of lead frames to electrodes of semiconductor chips for the rest of lead frames in accordance with predetermined bonding site data.

In addition, the controller operates so as to accomplish various function as mentioned with reference to the above mentioned method.

Accuracy with which inner leads are positioned in place has been enhanced due to development in lead frame fabrication technique and inner lead taping technique. Hence, there has been decreased necessity for carrying out recognition of bonding sites for all inner leads. However, if recognition of bonding sites is not carried out at all, there would leave a risk of inner leads being not correctly bonded to electrodes of a semiconductor chip. Thus, by utilizing statistic obtained by sampling a certain number of bonding sites, it is possible to solve the above mentioned problems in the prior art. The present invention is based on such a concept as mentioned above.

In accordance with the inventive method, bonding sites are pictorially recognized for the certain number of lead frames and analyzed to obtain coordinate data numerically expressing the bonding sites. Then, statistic is calculated based on the thus obtained coordinate data. The thus calculated statistic is compared with a predetermined threshold value. If the statistic is smaller than the predetermined threshold value, pictorial recognition of bonding sites are not carried out for the rest of lead frames, in which case inner leads of lead frames are wire-bonded to electrodes of semiconductor chips for the rest of lead frames either in accordance with predetermined bonding site data without pictorially recognizing bonding sites, or in accordance with coordinate data obtained by analyzing bonding sites of the certain number of lead frames.

Recognition of bonding sites for the rest of lead frames are omitted, only when the above mentioned statistic is smaller than a predetermined threshold value. Thus, the present invention makes it possible to shorten semiconductor device fabrication time, and thereby significantly enhance productivity.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
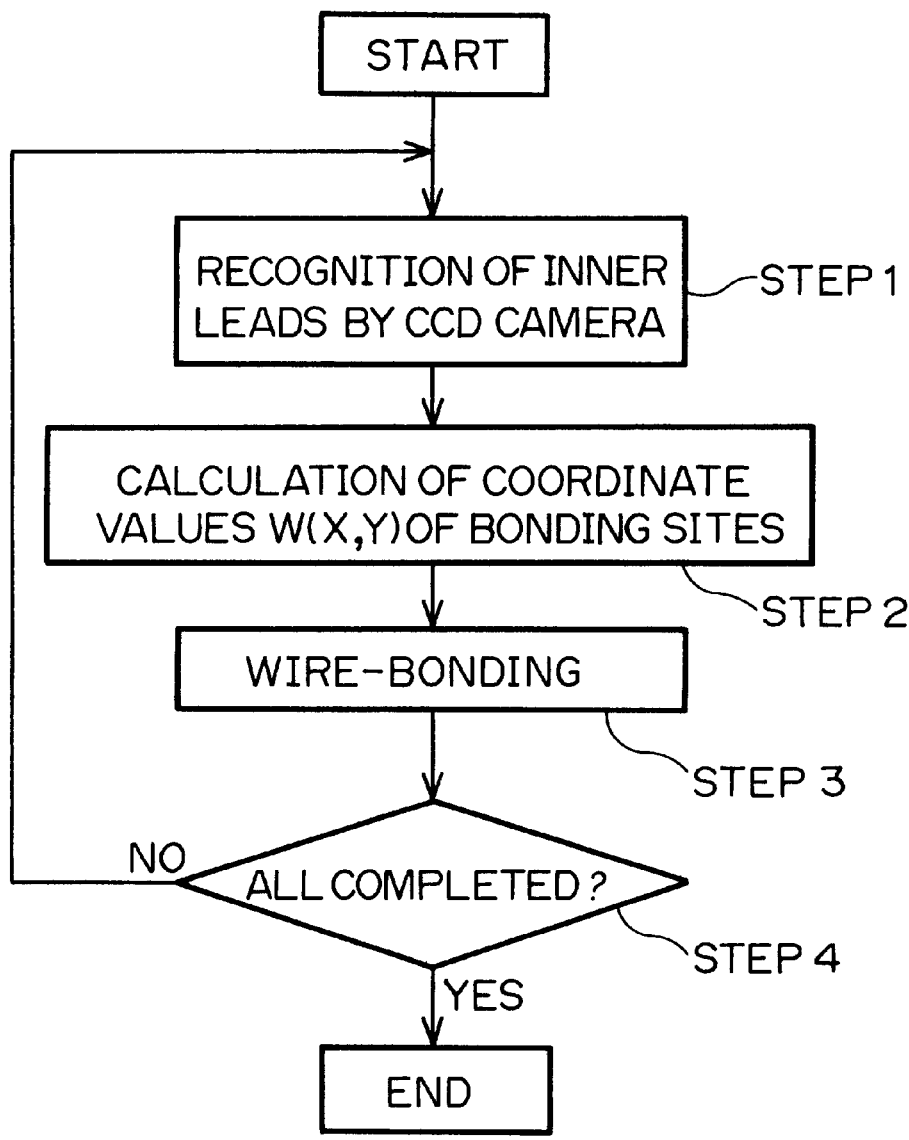
FIG. 1 is a flow chart of a conventional wire-bonding method.
Figure 2:
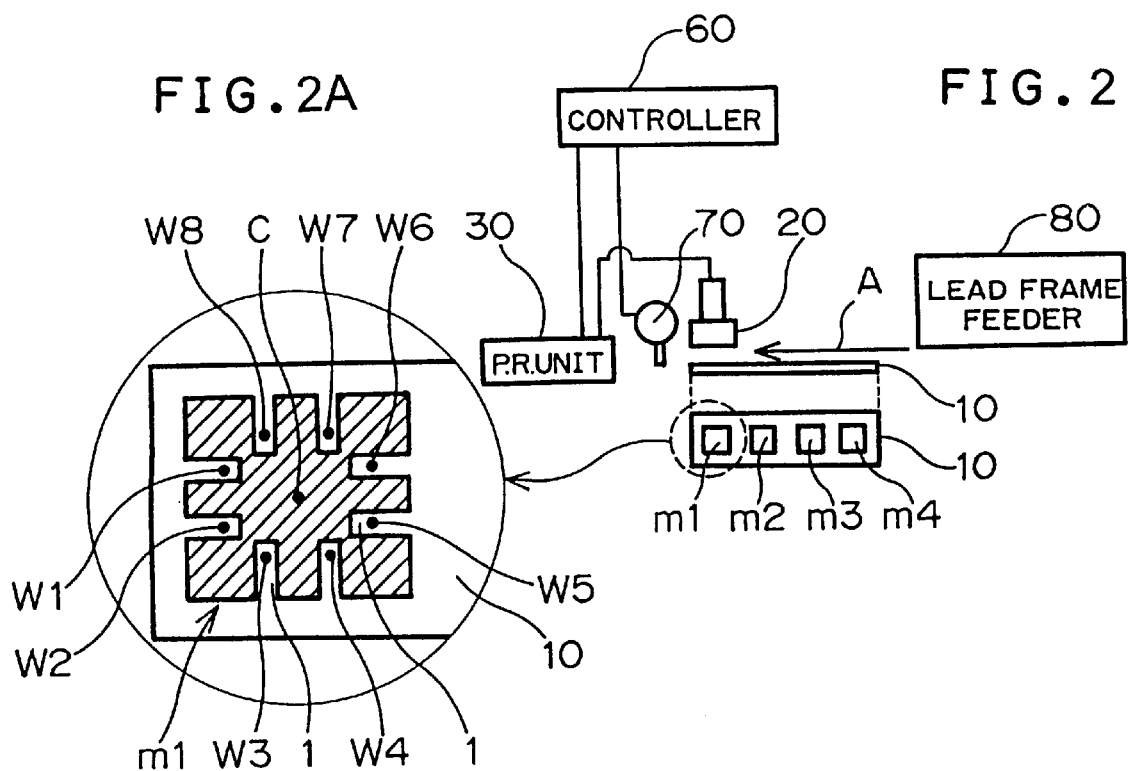
FIG. 2 is a schematic view including a partially enlarged view (FIG. 2A), illustrating a wire-bonding apparatus to be used for reducing the present invention to practice.

FIGS. 2 and 2A illustrate a wire-bonding apparatus for reducing the present invention to practice. The wire-bonding apparatus includes a lead frame feeder 80 for successively feeding lead frames 10 in a direction indicated with an arrow A. Above a lead frame feeding path is disposed a charged couple device (CCD) camera 20 which constitutes a part of a pictorial recognizing unit 30. The CCD camera 20 takes pictures of inner leads 1 of the lead frames 10 being successively fed for a certain number of the lead frames 10, for instance, for first to third lead frames 10, and the pictorially recognizing unit 30 pictorially recognizes bonding sites at which the inner leads 1 of the lead frames 10 are bonded to electrodes of a semiconductor chip, based on the pictures taken by the CCD camera 20. Then, the pictorially recognizing unit 30 creates signals indicative where the bonding sites are located in each of the inner leads 1, and transmits the signals to a controller 60.

There is disposed a wire-bonding head 70 downstream of the CCD camera 20. The wire-bonding head bonds the inner leads 1 to electrodes of a semiconductor chip at the bonding sites through wires. The wire-bonding head 70 is controlled in terms of its operation by the controller 60.

The controller 60 receives the signals concerning the bonding sites from the pictorially recognizing unit 30, and analyzes the received signals to obtain coordinate data numerically expressing the bonding sites. Specifically, the controller 60 calculates coordinate values W1 to W8 expressing the bonding sites in X-Y coordinate system having an origin C, which may be located anywhere. In the instant embodiment, the origin C is set to be located almost at the center of a semiconductor chip. The controller 60 calculates statistic about dispersion in the coordinate data, and then judges whether the thus calculated statistic is smaller or greater than a predetermined threshold value. If the calculated statistic is equal to or smaller the said predetermined threshold value, the controller 60 transmits an instruction signal to the pictorially recognizing unit 30 so as not to pictorially recognize bonding sites for the rest of lead frames. In this case, the controller 60 transmits an operation signal to the wire-bonding head 70 so as to wire-bond the inner leads 1 to the electrodes of a semiconductor chip for the rest of lead frames in accordance with predetermined bonding site data. In contrast, if the calculated statistic is greater than the predetermined threshold value, the controller 60 transmits an instruction signal to the pictorially recognizing unit 30 so as to pictorially recognize bonding sites for the rest of lead frames, in which case, the controller 60 does not transmit an operation signal to the wire-bonding head 70 so that the wire-bonding head 70 continues wire-bonding as usual.

Hereinbelow will be the explained operation of the controller 60 in detail.

Each of the lead frames 10 is formed with four locations m1 to m4 each of which includes eight inner leads 1 as illustrated in the enlarged portion of FIG. 2. As mentioned earlier, each of the bonding sites at which the inner leads 1 are bonded to electrodes of a semiconductor chip through thin metal wires is represented with the coordinate values W1 (X, Y) to W8 (X, Y). The positional relation between the origin C and the bonding site represented with the coordinate values Wn (X, Y) (n is an integer in the range of 1 to 8) is common for each of the locations m1 to m4. Hence, the bonding sites represented with Wn (X, Y) in the locations m1 to m4 have the same coordinate values.

A semiconductor chip is disposed at the center of each of the locations m1 to m4, namely in each of device holes of the lead frame 10. For instance, semiconductor chips are mounted on islands located in the locations m1 to m4 in a previous step, and then fed by the lead frame feeder 80. However, the present invention relates to recognition of the bonding sites of the inner leads, and is not concerned directly with a semiconductor, and hence a semiconductor chip is not illustrated in FIGS. 2, 4 and 5 for simplification of the drawings.

Figure 3:
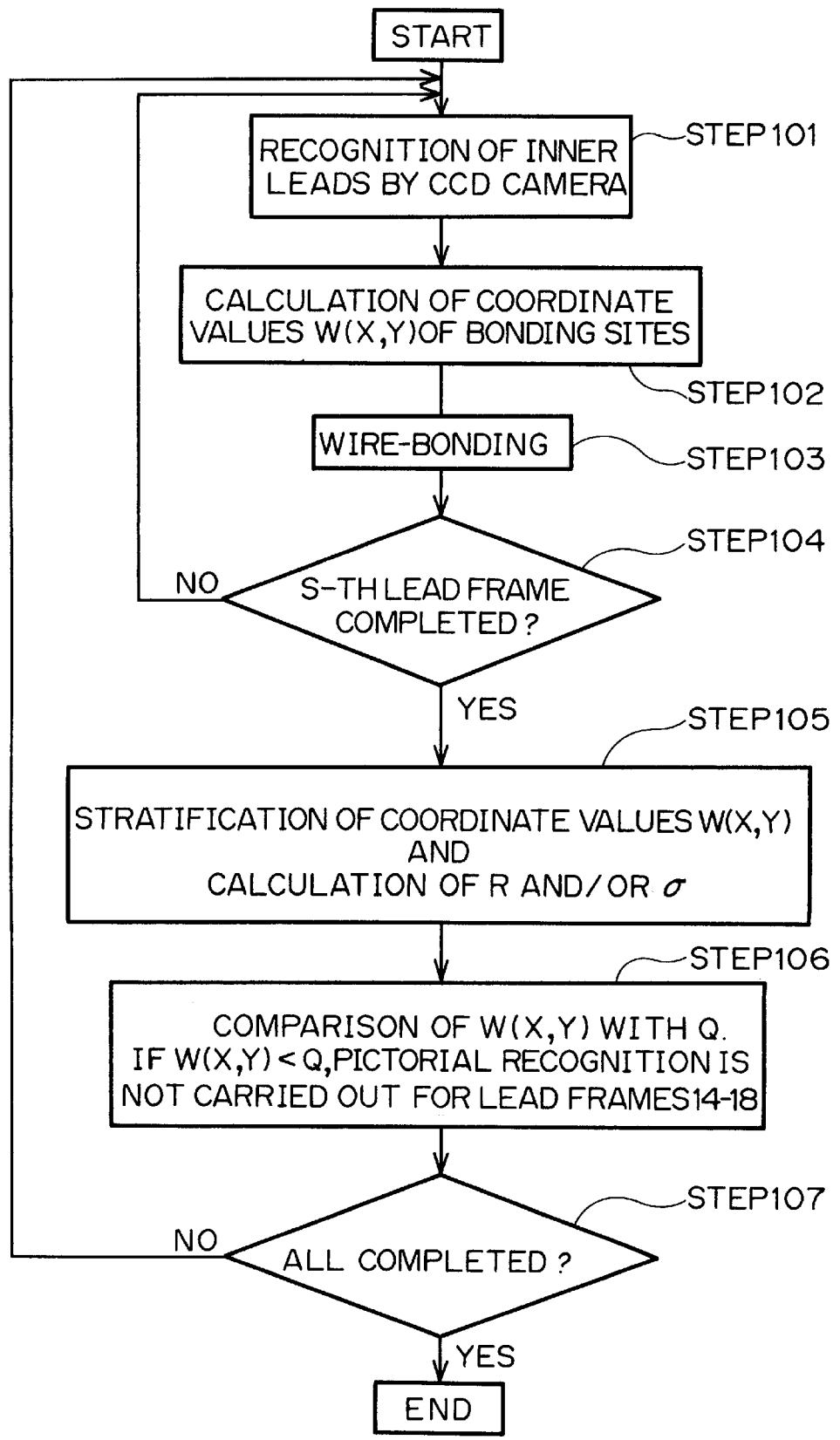
FIG. 3 is a flow chart of a method in accordance with the first embodiment of the present invention.

Hereinbelow, how the wire-bonding apparatus is operated by the controller 60 is explained with reference to FIGS. 3 and 4.

Figure 4:
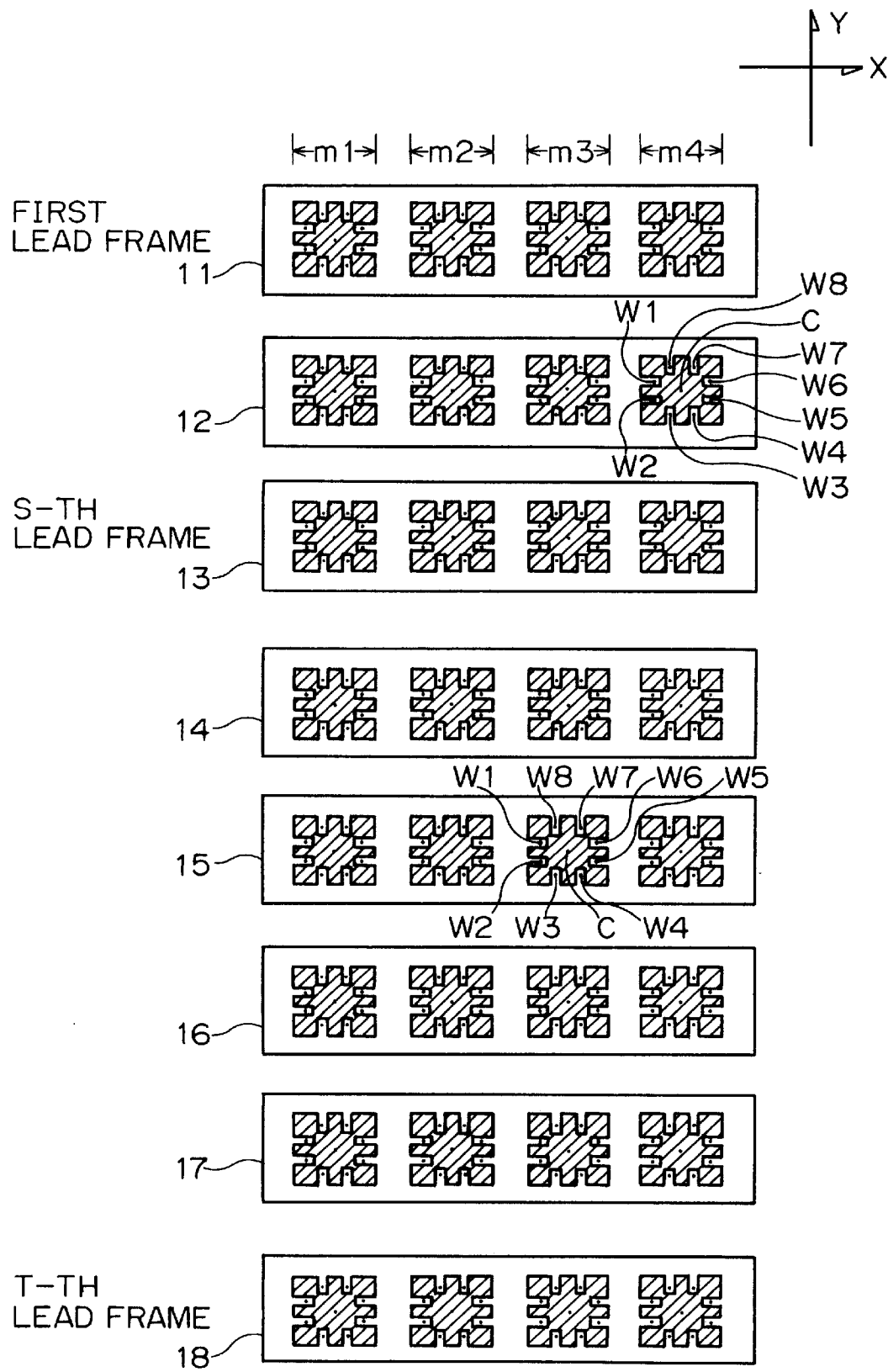
FIG. 4 is a schematic view illustrating lead frame data images in a method in accordance with the first embodiment of the present invention.

Supposing that one lot of lead frames including eight lead frames 11 to 18 is fed by the lead frame feeder 80, that each of the lead frames 11 to 18 has four locations m1 to m4, and that each of the locations m1 to m4 includes eight inner leads 1, as illustrated in FIG. 4. First, the following data is input to the controller 60:

m; the number of semiconductor chips in one lead frame, m being equal to 4 in the instant embodiment, W; the number of inner leads for a semiconductor chip, W being equal to 8 in the instant embodiment, S; the number of lead frames to be sampled, S being equal to 3 in the instant embodiment, T; the total number of lead frames, namely the number of a single lot of lead frames, T being equal to 8 in the instant embodiment, and Q; a threshold value, Q being equal to 50 $\mu$m in the instant embodiment.

The controller 60 causes the pictorially recognizing unit 30 and hence the CCD camera 20 to operate in such a way that the CCD camera 20 takes pictures of all the inner leads 1 of all the locations m1 to m4 for the lead frame 11, and the pictorially recognizing unit 30 creates signals indicating where the bonding sites are located, as shown in step 101. Then, the controller 60 analyzes the signals received from the pictorially recognizing unit 30 to thereby create coordinate date numerically expressing the bonding sites for all the inner leads 1 of the lead frame 11. That is, the controller 60 analyzes all the bonding sites for the lead frame 11, as shown in step 102.

Then, the controller 60 transmits an operation signal to the wire-bonding head 70 so as to carry out wire-bonding to the lead frame 11, as shown in step 103.

The above mentioned procedure is repeated also for the lead frames 12 and 13, as shown in step 104.

After the controller 60 has analyzed all the bonding sites for the lead frames 11 to 13 to thereby create the coordinate values W1 to W8 numerically expressing the bonding sites for all the inner leads 1 of each of the lead frames 11 to 13, the controller 60 stratifies the coordinate values into each of Wn (n=1–8) to thereby calculate statistic R or $\sigma$ for each of X and Y coordinate values, as shown in step 105. In other words, the controller 60 re-totalizes the coordinate data for each of the locations m1 to m4 and/or for each of the bonding sites Wn (n=1–8).

Herein, R indicates a difference between maximum and minimum values in the coordinate data, and $\sigma$ indicates a standard deviation for the coordinate data. In the instant embodiment, R is employed hereinafter as statistic.

The reason why the threshold value Q is set to be 50 $\mu$m is as follows. In general, a lead frame is designed at a formation accuracy equal to or smaller than 50 $\mu$m. Thus, by setting the threshold value Q to be 50 $\mu$m, if the statistic R is greater than 50 $\mu$m, it would be possible to feed back abnormality to a lead frame fabrication process by means of other methods than the method in accordance with the present invention.

The reason why the total number T of lead frames, namely, the number of a single lot of lead frames is input to the controller 60 is as follows. In IC assembly process, IC assembling is carried out in general for each of lots. Since each of lots includes a certain number of lead frames, distribution of dispersion in bonding sites, if any, would be common for each of lots. Thus, it would be possible to presume tendency of distribution of dispersion in bonding sites by carrying out pictorial recognition of lead frames for each of lots. The present invention is based on this concept. Hence, the distribution of dispersion in bonding sites would be different in other lots. Thus, if pictorial recognition is carried out for all lead frames without dividing the lead frames into lots, pictorial recognition might be improperly carried out. Accordingly, it is necessary to input the total number of lead frames into the controller 60 in order to inform that a lot is changed to a next lot.

As mentioned earlier, in the first embodiment, the controller 60 causes the pictorially recognizing unit 30 and the CCD camera 20 to carry out pictorial recognition for all the locations m1 to m4 of all the inner leads 1 for the lead frames 11 to 13, to thereby calculate the X and Y coordinate values of the bonding sites W1 to W8. Thus, the controller 60 calculates sixteen statistics, that is, eight statistics Rx with respect to an X axis and eight statistics Ry with respect to an Y axis for the eight bonding sites W1 to W8 for each of the twelve locations m1 to m4 of the lead frames 11 to 13 (hereinafter, Rx means a component of the statistic R in an X axis, and Ry means a component of the statistic R in an Y axis).

Then, the controller 60 compares the thus obtained statistics Rx and Ry with the threshold value Q (50 $\mu$m). If all the statistics Rx and Ry are smaller than Q, wire-bonding for the lead frames 14 to 18 is carried out without pictorial recognition therefor, as shown in step 106. In contrast, if at least one of the statistics Rx and Ry is greater than Q, wire-bonding for the lead frames 14 to 18 is carried out as usual, namely, with pictorial recognition being carried out therefor.

When the las lead frame 18 is wire-bonded with or without pictorial recognition therefor (step 17), the wire-bonding step is completed.

Figure 5:
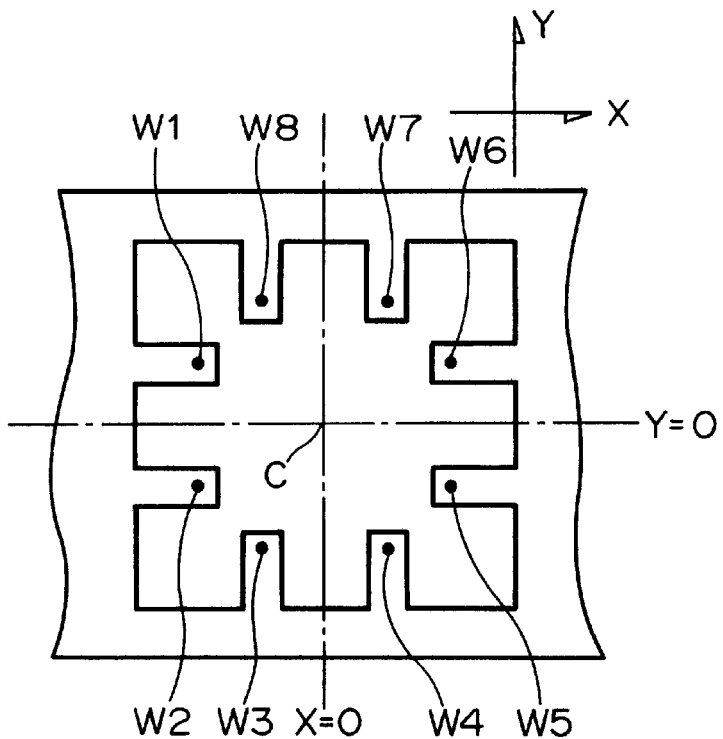
FIG. 5 is an enlarged view illustrating inner leads associated with a single IC chip.

For instance, as illustrated in FIG. 5, suppose that eight inner leads in a certain location have bonding sites Wn (n=1–8) expressed with X and Y coordinate values in a certain X and Y coordinate system having an origin C set to be located at the center of a semiconductor chip:

W1 (−4500, 2500); W2 (−4500, −2500); W3 (−2500, −4500) W4 (2500, −4500); W5 (4500, −2500); W6 (4500, 2500) W7 (2500, 4500); W8 (−2500, 4500).

Figure 6:
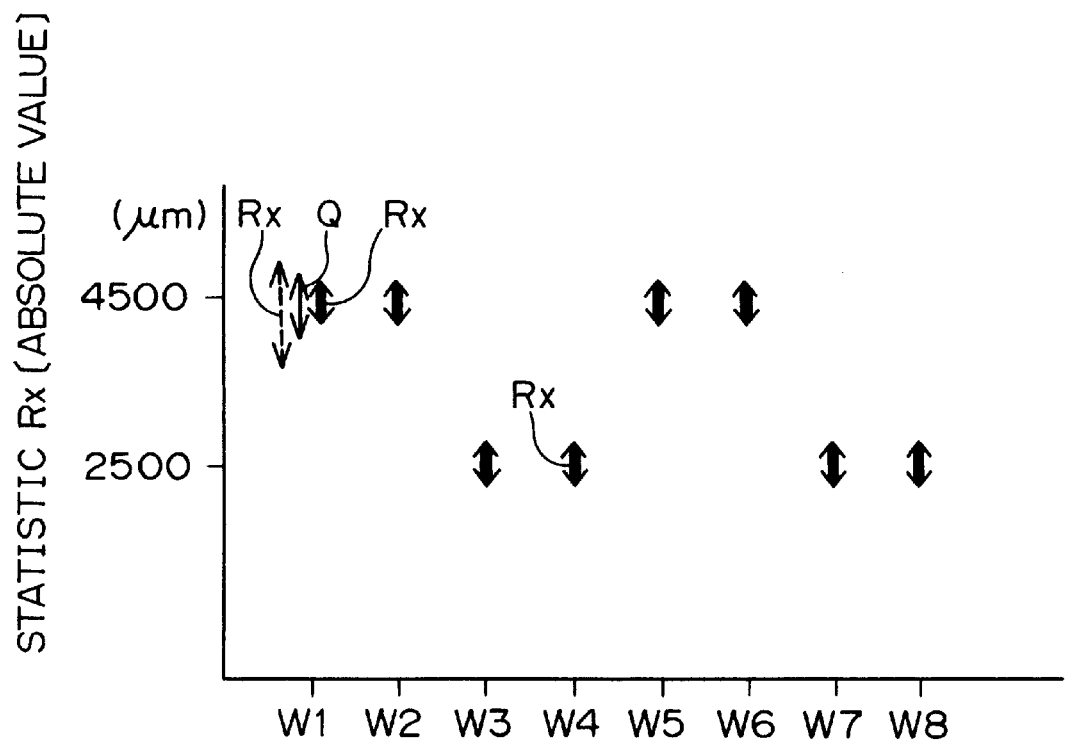
FIG. 6 is a graph showing dispersion in coordinate values of inner leads in a certain coordinate system.

Accordingly, the eight inner leads in the other locations have the same X and Y coordinate values as those mentioned above. If all the statistics Rx, which are statistics calculated by the controller 60 based on the X coordinate values of the bonding sites in all the locations with respect to an X axis, is equal to or smaller than Q, as illustrated in FIG. 6, and further if all the statistics Ry, which are statistics calculated by the controller 60 based on the Y coordinate values of the bonding sites in all the locations with respect to a Y axis, is equal to or smaller than Q, the pictorial recognition of bonding sites for the lead frames 14 to 18 are omitted.

In contrast, if the statistic Rx (shown with a broken line in FIG. 6) for the bonding site W1 is greater than the threshold value Q, the pictorial recognition is carried out for all the inner leads of the lead frames 14 to 18, and then wire-bonding is carried out for the lead frames 14 to 18.

In the above mentioned first embodiment, the number of semiconductor chips "m" in one lead frame, the number of inner leads "W" for a semiconductor chip, the number of lead frames "S" to be sampled, the total number of lead frames "T", and the threshold value, Q are exemplified as 4, 8, 3, 8 and 50 $\mu$m, respectively, however it should be noted that they may be replaced with other figures.

Figure 7:
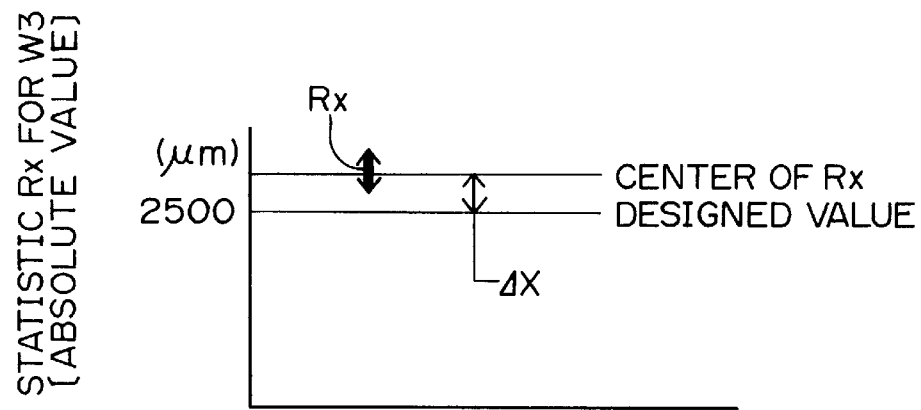
FIG. 7 shows a gap between dispersion in coordinate values of inner leads and desired coordinate values in a method in accordance with the second embodiment of the present invention.

A method in accordance with the second embodiment is explained hereinbelow with reference to FIG. 7. Herein, suppose that all the statistics Rx and Ry are equal to or smaller than the threshold value Q, and that the statistic Rx in the bonding sites W3 (−2500, −4500), for instance, is deviated from a designed value by $\Delta X$, measuring from the center of the statistic Rx. If the deviation $\Delta X$ is within an allowable range, the controller 60 amends the X coordinate values of the bonding sites W3 in the lead frames 14 to 18 to be (−2500 $\mu$m+$\Delta X$). Then, the controller 60 transmits an instruction signal to the pictorially recognizing unit 30 not to pictorially recognize the lead frames 14 to 18, and further transmits an operation signal to the wire-bonding head 70 to carry out wire-bonding to the lead frames 14 to 18 in such a manner that the X coordinate value of the bonding sites W3 is (−2500 $\mu$m+$\Delta X$).

In accordance with the second embodiment, the lead frames 14 to 18 are wire-bonded on the basis of the results of analysis on the coordinate values of the bonding sites of the lead frames 11 to 13.

A method in accordance with the third embodiment is explained hereinbelow with reference to FIG. 8. In accordance with the third embodiment, if the statistic Rx in the bonding sites W1 is greater than the threshold value Q, as illustrated in FIG. 6 with a broken line, the controller 60 further analyzes the coordinate values numerically expressing the bonding site to thereby find that the deviation of the statistic Rx from the threshold value Q is found in which location. In general, lead frames are fed keeping the same orientation as the orientation with which the lead frames were punched by means of a forming die, and hence there may be found the dependency of the deviation of the statistic Rx on a forming die.

Figure 8:
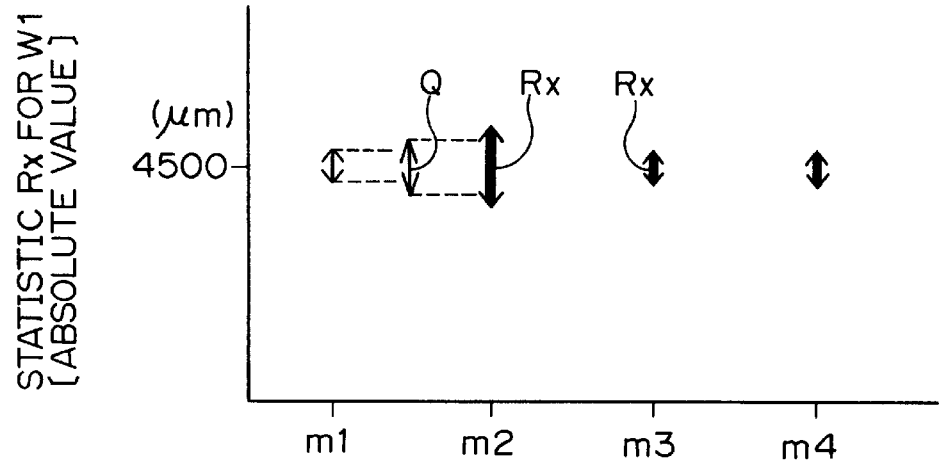
FIG. 8 is a graph showing dispersion in coordinate values of inner leads in each of locations in a certain coordinate system.

FIG. 8 is a graph showing the statistics Rx in the bonding sites W1 of the lead frames 11 to 13. Herein, suppose that only the statistic Rx in the location m2 is greater than the threshold value Q, and the statistics Rx in the other locations m1, m3 and m4 are equal to or greater than the threshold value Q. Thus, the controller 60 transmits an instruction signal to the pictorially recognizing unit 30 to pictorially recognize the lead frames 14 to 18 only with respect to the bonding sites W1 in the location m2, and not to pictorially recognize the bonding sites W1 in the other locations m1, m3 and m4, and further transmits an operation signal to the wire-bonding head 70 to wire-bond the lead frames 14 to 18 accordingly. As an alternative, the controller 60 may transmit an instruction signal to the pictorially recognizing unit 30 to pictorial recognize the lead frames 14 to 18 only with respect to the X axis coordinate value of the bonding site W1 in the location m2, and not to pictorially recognize the other bonding sites W2 to W8 in the location m2.

In accordance with the third embodiment, even if the statistic Rx in one of the bonding sties is greater than the threshold value Q, as illustrated in FIG. 8 with a broken line, it is possible to shorten a time required for pictorially recognizing the bonding sites W1 to W8 of the lead frames 14 to 18.

In a variant of the third embodiment, the controller 60 may transmit an instruction signal to the pictorially recognizing unit 30 to pictorially recognize all the bonding sites W1 to W8 in the location m2 of all the lead frames 11 to 18, and not to pictorially recognize the bonding sites W1 to W8 in the other locations m1, m3 and m4 of the lead frames 11 to 18. In place of pictorial recognition of all the bonding sites W1 to W8 in the location m2, X or Y axis coordinate value of the bonding sites W1 to W8 in the location m2 may be pictorially recognized.

As an alternative, the controller 60 may transmit an instruction signal to the pictorially recognizing unit 30 to carry out pictorial recognition of all the bonding sites W1 for the lead frames 14 to 18, in which case the bonding sites W2 to W8 of the lead frames 14 to 18 are not pictorially recognized. After the comparison of the statistic R with the threshold value Q as illustrated in FIG. 8, the controller 60 determines which manner to select among the above mentioned manners, taking many factors into consideration such as which is greater between the dependency on the location m and the dependency on the bonding sites W, and balancing a time required for pictorial recognition and fabrication yield.

In the above mentioned third embodiment, only one location m2 is selected to be pictorially recognized, however, it should be noted that more than one locations may be selected. In accordance with the third embodiment, if there is any correlation or dependency in accuracy of the bonding sites of the inner leads in one or more locations, the controller 60 stratifies the coordinate data numerically expressing the bonding sites into the bonding sites or into the locations to thereby obtain the statistics R or Rx and Ry. In brief, in the third embodiment, the statistic R is compared with the threshold value Q for each of the locations, and pictorial recognition of the bonding sites is omitted for each of the locations in the lead frames 14 to 18.

As having been described in connection with the preferred embodiments, in accordance with the present invention if a dispersion in the bonding sites of the inner leads of the certain number of the lead frames is greater than a predetermined threshold value, the pictorial recognition is continued for the lead frames 14 to 18, whereas if the dispersion is equal to or smaller than the threshold value, the pictorial recognition is omitted for the rest of lead frames. Thus, it is possible to omit fabrication time required for pictorial recognition of the rest of the lead frames. Hence, the present invention makes it possible to shorten IC chip fabrication time with IC chip quality maintained.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-136675 filed on May 30, 1996 including specification, claims, drawings and summary is incorporated herein by reference in its entirety.

What is claimed is:

1. A method of wire-bonding inner leads of lead frames to electrodes of semiconductor chips, comprising the steps of:

(a) pictorially recognizing bonding sites at which inner leads of a lead frame are to be bonded to electrodes of a semiconductor chip for a certain number of lead frames among a plurality of lead frames, said certain number of lead frames including a lead frame located at a head of said plurality of lead frames, and analyzing said bonding sites to obtain coordinate data numerically expressing said bonding sites;

(b) calculating a statistic about the dispersion in the thus obtained coordinate data;

(c) judging whether the thus calculated statistic is smaller or greater than a predetermined threshold value; and (d) bonding inner leads of lead frames to electrodes of semiconductor chips for the rest of the lead frames in accordance with a predetermined bonding site data without pictorially recognizing bonding sites thereof, if the statistic calculated in said step (c) is equal to or smaller than said predetermined threshold value, or bonding inner leads of lead frames to electrodes of semiconductor chips for the rest of the lead frames by pictorially recognizing bonding sites in advance for the rest of lead frames, if the statistic calculated in said step (c) is greater than said predetermined threshold value.

2. The method as set forth in claim 1, wherein coordinate data obtained by analyzing bonding sites of said certain number of lead frames is employed in said step (d) in place of said predetermined bonding site data.

3. The method as set forth in claim 1, wherein if said statistic is greater than said predetermined threshold value for a bonding site in a certain inner lead, corresponding bonding sites are analyzed for inner leads of the rest of lead frames.

4. The method as set forth in claim 1, wherein each of said lead frames is formed with a plurality of locations in which a plurality of inner leads are arranged, and wherein bonding sites are analyzed in said step (a) for each of said locations.

5. The method as set forth in claim 1, wherein bonding sites are analyzed in said step (a) for each of corresponding inner leads in said plurality of lead frames.

6. The method as set forth in claim 1, wherein each of said lead frames is formed with a plurality of locations in which a plurality of inner leads are arranged, and wherein bonding sites are analyzed in said step (a) for each of said locations and further for each of corresponding inner leads in said plurality of lead frames.

7. The method as set forth in claim 1, wherein said predetermined threshold value is a difference between maximum and minimum values in said dispersion in said coordinate data.

8. The method as set forth in claim 1, wherein said predetermined threshold value is a standard deviation for said dispersion in said coordinate data.

9. The method as set forth in claim 1, wherein said predetermined threshold value is 50 $\mu$m.

10. The method as set forth in claim 1, wherein said certain number of lead frames is equal to the number of one lot of lead frames.

11. The method as set forth in claim 1, wherein said statistic is calculated in said step (b) about how said bonding sites are deviated in two axes perpendicular to each other from correct sites at which said bonding sites should be located.

12. The method as set forth in claim 1, wherein if a bonding site in a lead frame among said certain number of lead frames is found by pictorial recognition in said step (a) to be deviated from a correct site thereof in an axis by a certain value which is within an allowable range, corresponding bonding sites in the rest of lead frames are dealt with as they are deviated from correct sites thereof by said certain value.

13. The method as set forth in claim 1, wherein if a bonding site in a certain location of a lead frame among said certain number of lead frames is found by pictorial recognition in said step (a) to be greater than said predetermined threshold value, all of said bonding sites in a corresponding location of all of said lead frames are pictorially recognized.

14. The method as set forth in claim 13, wherein if a bonding site in a certain location of a lead frame among said certain number of lead frames is found by pictorial recognition in said step (a) to be greater than said predetermined threshold value in an axis, all of said bonding sites in a corresponding location of all of said lead frames are pictorially recognized in said axis.

15. The method as set forth in claim 1, wherein bonding sites in a certain location of said certain number of lead frames are pictorially recognized, and bonding sites in the rest of locations are not pictorially recognized.

* * * * *